United States Patent
Lin et al.

(10) Patent No.: US 9,275,894 B2
(45) Date of Patent: Mar. 1, 2016

(54) METHOD FOR FORMING SEMICONDUCTOR DEVICE STRUCTURE

(71) Applicant: Taiwan Semiconductor Manufacturing Co., Ltd., Hsin-Chu (TW)

(72) Inventors: Chi-Feng Lin, Hsinchu (TW); Kuan-Chia Chen, Hsinchu (TW); Ching-Hua Hsieh, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 129 days.

(21) Appl. No.: 14/161,247

(22) Filed: Jan. 22, 2014

(65) Prior Publication Data
US 2015/0206791 A1   Jul. 23, 2015

(51) Int. Cl.
*H01L 21/44* (2006.01)
*H01L 21/768* (2006.01)

(52) U.S. Cl.
CPC .... *H01L 21/76802* (2013.01); *H01L 21/76877* (2013.01)

(58) Field of Classification Search
USPC .......................................................... 438/597
See application file for complete search history.

(56) References Cited

U.S. PATENT DOCUMENTS

| 2013/0244424 A1* | 9/2013 | Edelstein et al. | 438/653 |
| 2014/0183738 A1* | 7/2014 | Jezewski et al. | 257/751 |

* cited by examiner

*Primary Examiner* — Asok K Sarkar
(74) *Attorney, Agent, or Firm* — Birch, Stewart, Kolasch & Birch, LLP

(57) ABSTRACT

In accordance with some embodiments, a method for forming a semiconductor device structure is provided. The method includes forming a dielectric layer on a semiconductor substrate. The dielectric layer has at least one first trench in the dielectric layer. The method also includes forming a seed layer on a sidewall and a bottom surface of the first trench. The method further includes forming a first conductive layer on the seed layer. The method includes performing a thermal treatment process to melt and transform the seed layer and the first conductive layer into a second conductive layer. The method also includes forming a third conductive layer on the second conductive layer to fill the first trench.

19 Claims, 6 Drawing Sheets

METHOD FOR FORMING SEMICONDUCTOR DEVICE STRUCTURE

BACKGROUND

The semiconductor integrated circuit (IC) industry has experienced rapid growth. Technological advances in IC materials and designs have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor device structures with smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
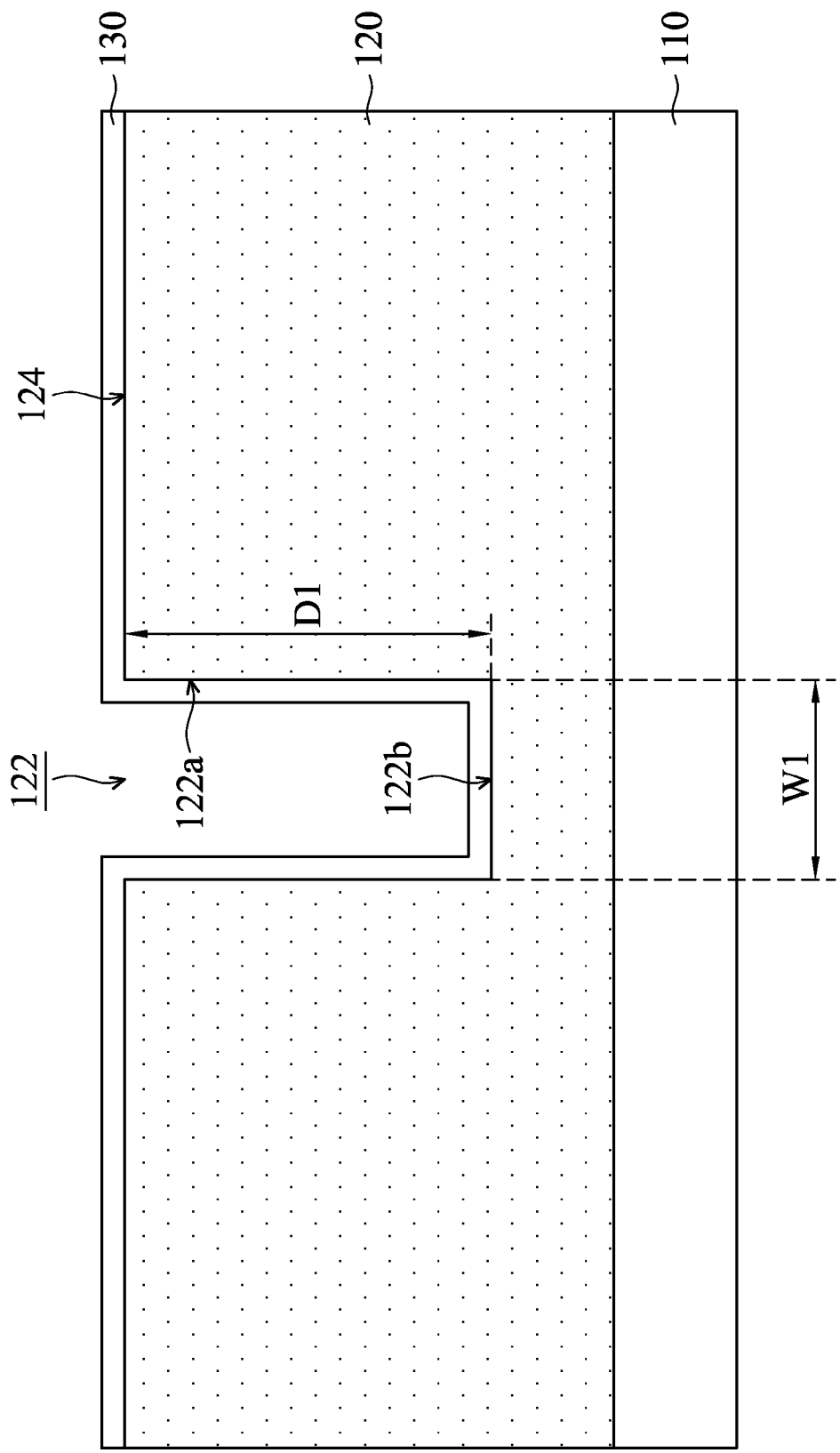
FIGS. 1A-1F are cross-sectional views of various stages of a process for forming a semiconductor device structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIGS. 1A-1F are cross-sectional views of various stages of a process for forming a semiconductor device structure, in accordance with some embodiments. As shown in FIG. 1A, a semiconductor substrate 110 is provided, in accordance with some embodiments. The semiconductor substrate 110 is a semiconductor wafer (such as a silicon wafer) or a portion of a semiconductor wafer, in accordance with some embodiments.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. The semiconductor substrate 110 may also include multi-layer semiconductors, semiconductor on insulator (SOI) (such as silicon on insulator or germanium on insulator), or a combination thereof.

In some embodiments, a dielectric layer 120 is then deposited over the semiconductor substrate 110, in accordance with some embodiments. The dielectric layer 120 is made of any suitable dielectric material, such as hydrogenated silicon oxycarbide (SiCO:H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments.

The dielectric layer 120 is deposited by any suitable process, such as a CVD process, HDPCVD process, spin-on process, sputtering process, or a combination thereof, in accordance with some embodiments. Thereafter, a first trench 122 is formed in the dielectric layer 120, in accordance with some embodiments. In some embodiments, the first trench 122 is formed by a photolithography process and an etching process. In some embodiments, the first trench 122 has a width W1 that ranges from about 5 nm to about 90 nm. In some embodiments, the width W1 ranges from about 10 nm to about 50 nm. In some embodiments, the first trench 122 has a depth D1 that ranges from about 100 nm to about 5000 nm. In some embodiments, the depth D1 ranges from about 300 nm to about 3000 nm. In some embodiments, an aspect ratio (D1/W1) of the first trench 122 ranges from about 3 to about 300. In some embodiments, an aspect ratio (D1/W1) of the first trench 122 ranges from about 6 to about 60.

Afterwards, a barrier layer 130 is formed on a surface 124 of the dielectric layer 120, and a sidewall 122a and a bottom surface 122b of the first trench 122, in accordance with some embodiments. The barrier layer 130 is configured to block the diffusion of metal atoms of a metal layer subsequently formed on the barrier layer 130, in accordance with some embodiments.

In some embodiments, the barrier layer 130 includes titanium, titanium nitrides, tantalum, tantalum nitrides or other suitable materials. In some embodiments, the barrier layer 130 is formed by a physical vapor deposition (PVD) process, a chemical vapor deposition (CVD) process, an electroless plating process or another suitable process.

Figure 1B:
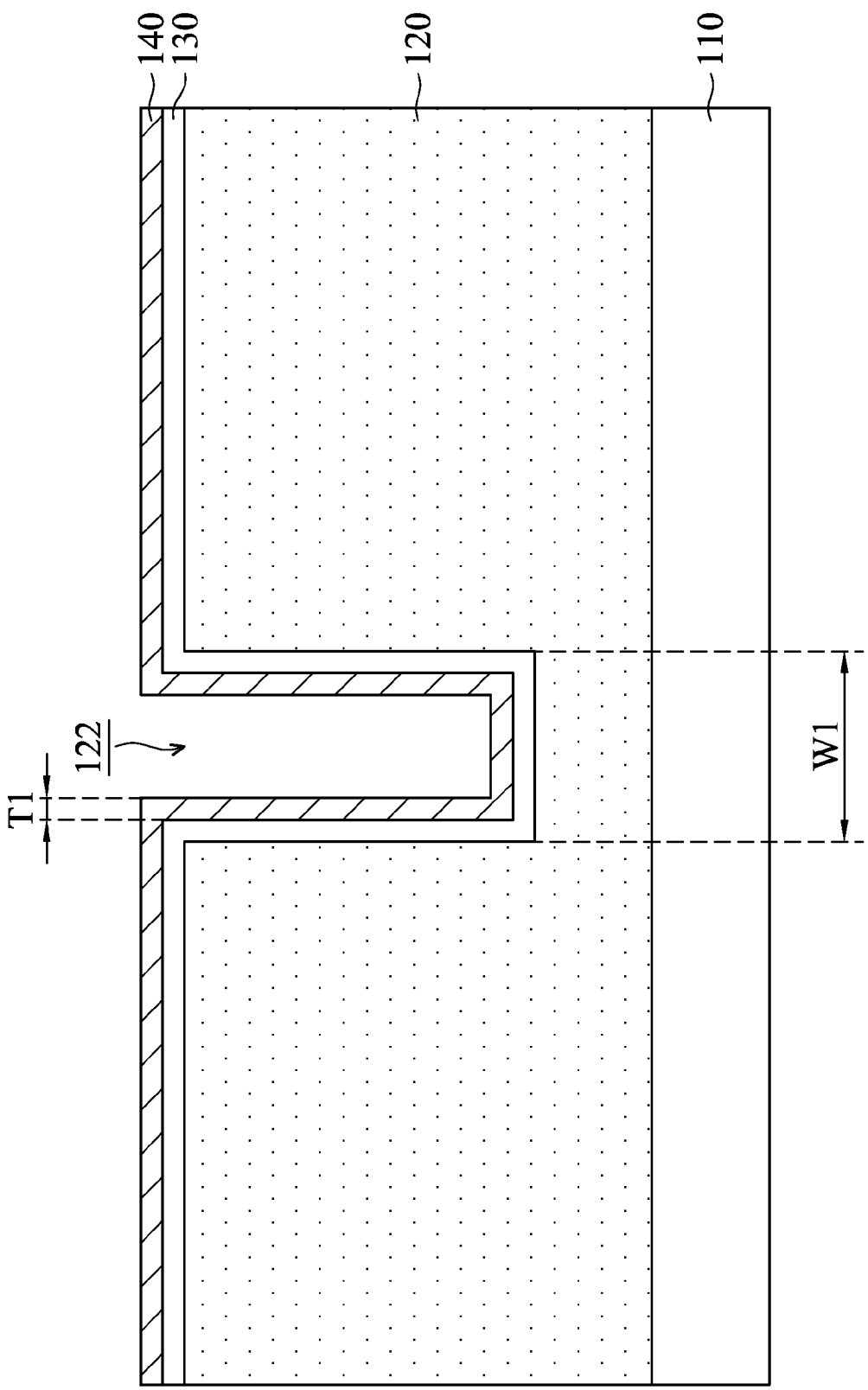

Thereafter, as shown in FIG. 1B, a seed layer 140 is formed on the barrier layer 130, in accordance with some embodiments. The seed layer 140 includes copper, copper alloys, cobalt (Co), ruthenium (Ru) or other suitable conductive materials, in accordance with some embodiments. In some embodiments, the seed layer 140 is formed by a physical vapor deposition (PVD) process, a chemical vapor deposition (CVD) process, an electroless plating process or another suitable process.

In some embodiments, the seed layer 140 has a thickness T1 that ranges from about 0.5 nm to about 16 nm. In some embodiments, the thickness T1 ranges from about 1.5 nm to about 8 nm. In some embodiments, a ratio (T1/W1) of the thickness T1 of the seed layer 140 to the width W1 of the first trench 122 ranges from about 0.0056 to about 0.9. In some embodiments, the ratio (T1/W1) of the thickness T1 of the seed layer 140 to the width W1 of the first trench 122 ranges from about 0.03 to about 0.6.

Figure 1C:
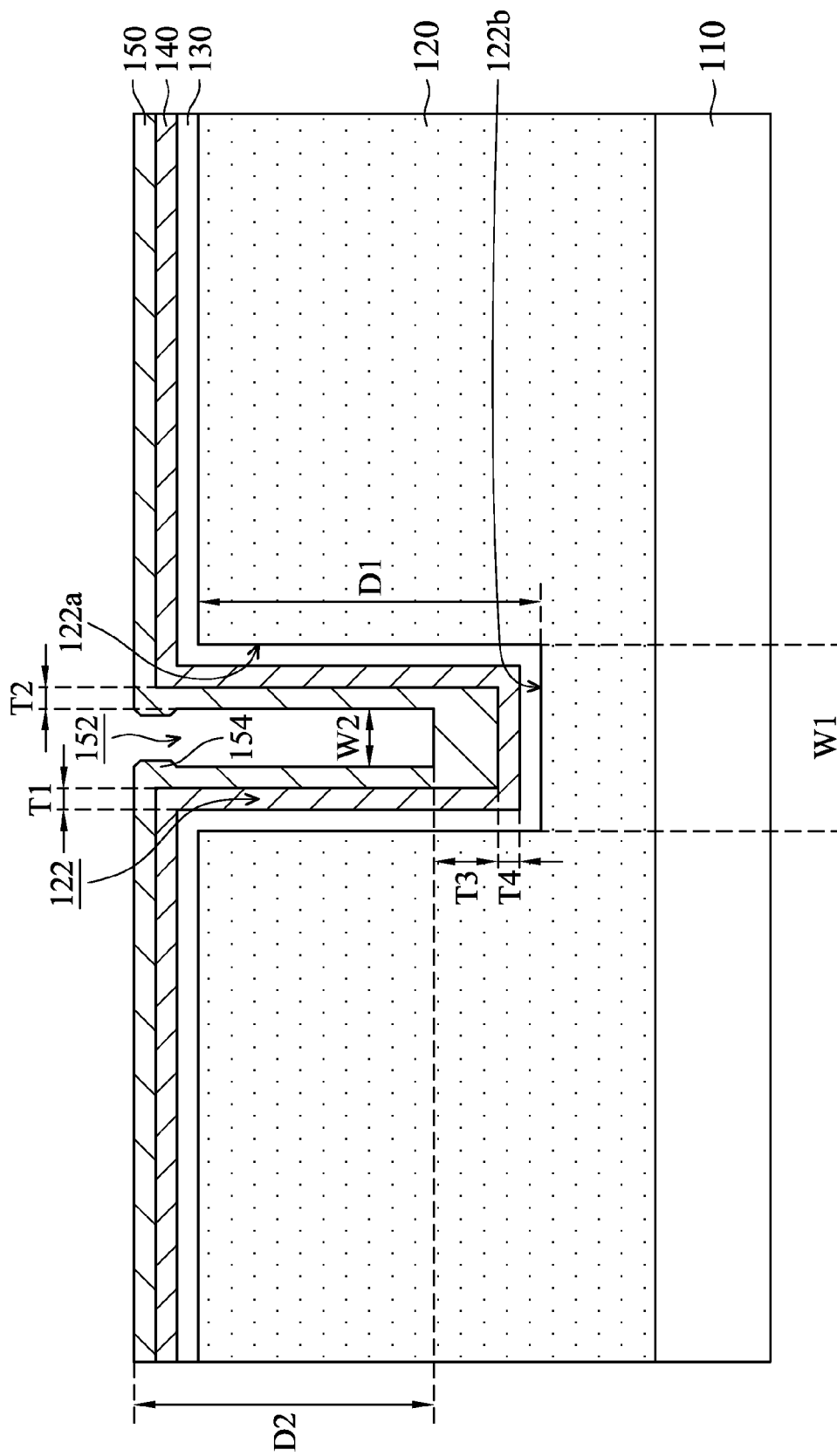

Afterwards, as shown in FIG. 1C, a conductive layer 150 is deposited on the seed layer 140, in accordance with some embodiments. In some embodiments, the conductive layer 150 is made of any suitable conductive material, such as copper, a copper alloy, silver, gold, or a combination thereof. The conductive layer 150 is deposited by an electrochemical plating process, an electroless plating process or other suitable processes. The deposition solution used to deposit the conductive layer 150 may contain additives (such as accelerators, suppressors and/or levelers).

The deposition rate of the conductive layer 150 includes a trench bottom deposition rate and a trench sidewall deposition rate. The trench bottom deposition rate is the rate of deposition of material on the bottom surface 122b of the first trench 122. The trench sidewall deposition rate is the rate of deposition of material on the sidewall 122a of the first trench 122. In some embodiments, a ratio of a trench bottom deposition rate to a trench sidewall deposition rate of the conductive layer 150 ranges from about 1 to about 50. In some embodiments, the ratio of the trench bottom deposition rate to the trench sidewall deposition rate of the conductive layer 150 ranges from about 1 to about 30.

In some embodiments, the trench bottom deposition rate is greater than the trench sidewall deposition rate of the conductive layer 150. The ratio of the trench bottom deposition rate to the trench sidewall deposition rate of the conductive layer 150 is larger than about 1 and smaller than or equal to about 50, in accordance with some embodiments. The ratio of the trench bottom deposition rate to the trench sidewall deposition rate of the conductive layer 150 is larger than about 1 and smaller than or equal to about 30, in accordance with some embodiments.

In some embodiments, the conductive layer 150 is deposited by an electrochemical plating process, and the electron dose used to deposit the conductive layer 150 ranges from about 0.007 coulomb/cm$^2$ to about 0.1 coulomb/cm$^2$. In some embodiments, the conductive layer 150 is deposited by an electrochemical plating process, and the electron dose used to deposit the conductive layer 150 ranges from about 0.014 coulomb/cm$^2$ to about 0.05 coulomb/cm$^2$.

In some embodiments, the conductive layer 150 has a second trench 152 in the first trench 122. In some embodiments, the second trench 152 has a width W2 ranging from about 2 nm to about 70 nm. In some embodiments, the width W2 ranges from about 2 nm to about 50 nm. In some embodiments, a ratio (W2/W1) of the width W2 of the second trench 152 to the width W1 of the first trench 122 ranges from about 0.02 to about 0.9. In some embodiments, the ratio (W2/W1) of the width W2 of the second trench 152 to the width W1 of the first trench 122 ranges from about 0.04 to about 0.8.

In some embodiments, a ratio (T2/W1) of a side thickness T2 of a portion of the conductive layer 150 on the sidewall 122a to the width W1 of the first trench 122 ranges from about 0.01 to about 0.9. In some embodiments, the ratio (T2/W1) of the side thickness T2 of the portion of the conductive layer 150 on the sidewall 122a to the width W1 of the first trench 122 ranges from about 0.03 to about 0.7.

In some embodiments, the conductive layer 150 on the bottom surface 122b of the first trench 122 has a bottom thickness T3 ranging from about 4.5 nm to about 44 nm. In some embodiments, the bottom thickness T3 ranges from about 6.5 nm to about 32 nm. In some embodiments, a ratio of the sum (T3+T4) of the bottom thickness T3 of the conductive layer 150 and a bottom thickness T4 of the seed layer 140 to the depth D1 of the first trench 122 ranges from about 0.001 to about 0.6. In some embodiments, the ratio of the sum (T3+T4) of the bottom thicknesses T3 and T4 to the depth D1 of the first trench 122 ranges from about 0.0027 to about 0.13. In some embodiments, the ratio of the sum of the thicknesses T3 and T4 to the depth D1 of the first trench 122 is greater than or equal to about 0.33.

Figure 1D:
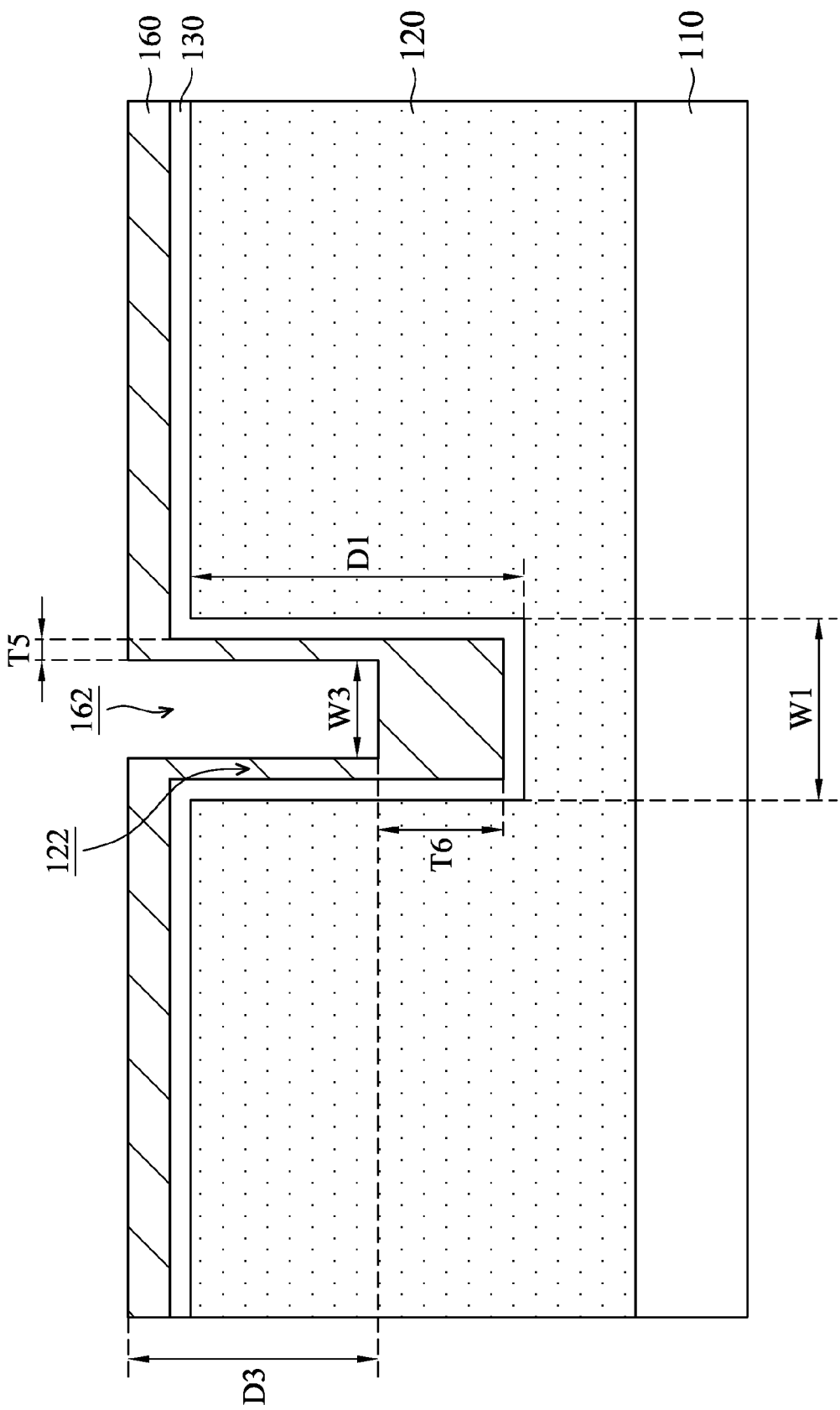

Thereafter, as shown in FIGS. 1C and 1D, a thermal treatment process is performed to melt and transform the seed layer 140 and the conductive layer 150 into a conductive layer 160, in accordance with some embodiments. The thermal treatment process is performed by using a hot plate, a lamp heating system, a furnace tube or other suitable heating systems. In some embodiments, the thermal treatment temperature of the thermal treatment process ranges from about 40° C. to about 400° C. In some embodiments, the thermal treatment temperature of the thermal treatment process ranges from about 40° C. to about 200° C.

In some embodiments, a processing time of the thermal treatment process ranges from about 5 seconds to about 300 seconds. In some embodiments, the processing time of the thermal treatment process ranges from about 10 seconds to about 60 seconds. In some embodiments, the thermal treatment temperature of the thermal treatment process ranges from about 100° C. to about 200° C., and the processing time of the thermal treatment process ranges from about 20 seconds to about 40 seconds. In some embodiments, the thermal treatment temperature of the thermal treatment process ranges from about 200° C. to about 250° C., and the processing time of the thermal treatment process ranges from about 5 seconds to about 10 seconds. In some embodiments, a sidewall thickness T5 of the conductive layer 160 is greater than or equal to 2 nm.

During the thermal treatment process, the melted conductive material from the seed layer 140 and the conductive layer 150 flows down to the bottom surface 122b of the trench 122 so as to form the conductive layer 160, in accordance with some embodiments. Therefore, the conductive layer 160 has a bottom thickness T6 greater than the sum (T3+T4) of the bottom thicknesses of the seed layer 140 and the conductive layer 150. As a result, a third trench 162 of the conductive layer 160 has a depth D3 that is less than a depth D2 of the second trench 152 of the conductive layer 150. In some embodiments, the bottom thickness T6 is able to be adjusted by adjusting the thicknesses of the seed layer 140 and the conductive layer 150.

In some embodiments, the conductive layer 160 has a sidewall thickness T5 that is less than the sum (T1+T2) of the sidewall thicknesses of the seed layer 140 and the conductive layer 150. As a result, the third trench 162 of the conductive layer 160 has a width W3 greater than the width W2 of the second trench 152 of the conductive layer 150. Therefore, an aspect ratio of the third trench 162 is smaller than that of the second trench 152. Hence, the thermal treatment process may form the third trench 162 with a small aspect ratio to facilitate the filling of a conductive layer subsequently formed into the third trench 162.

In some embodiments, the conductive layer 150 has an opening overhang 154 at the top corner of the second trench 152, and the thermal treatment process melts the opening overhang 154. Therefore, the melted conductive material from the opening overhang 154 flows down, such that the opening of the third trench 162 is larger than the opening of the second trench 152. If the seed layer 140 and the conductive layer 150 in the first trench 122 have some discontinuous defects, the thermal treatment process may repair the discontinuous defects.

The conductive layer 160 has a sidewall thickness T5 and a bottom thickness T6, in accordance with some embodiments. The sidewall thickness T5 ranges from about 0.5 nm to about 40 nm, in accordance with some embodiments. The sidewall thickness T5 ranges from about 1 nm to about 10 nm, in accordance with some embodiments. In some embodiments, the sidewall thickness T5 is greater than or equal to 2 nm. The ratio of the sidewall thickness T5 to the sum (T1+T2) of the sidewall thickness T1 of the seed layer 140 and the sidewall thickness T2 of the conductive layer 150 ranges from about 0.011 to about 0.95, in accordance with some embodiments. The ratio of the sidewall thickness T5 to the sum (T1+T2) of the sidewall thicknesses T1 and T2 ranges from about 0.067 to about 0.9, in accordance with some embodiments.

The bottom thickness T6 ranges from about 5 nm to about 1000 nm, in accordance with some embodiments. The bottom thickness T6 ranges from about 8 nm to about 500 nm, in accordance with some embodiments. A ratio of the bottom thickness T6 to the sum (T3+T4) of the bottom thickness T3 of the conductive layer 150 and the bottom thickness T4 of the seed layer 140 ranges from about 1.05 to about 200, in accordance with some embodiments. The ratio of the bottom thickness T6 to the sum (T3+T4) of the bottom thicknesses T3 and T4 ranges from about 1.1 to about 62.5, in accordance with some embodiments. A ratio of the bottom thickness T6 to the depth D1 of the first trench 122 ranges from about 0.002 to about 0.95, in accordance with some embodiments. The ratio of the bottom thickness T6 to the depth D1 of the first trench 122 ranges from about 0.0027 to about 0.8, in accordance with some embodiments.

The width W3 of the trench 162 ranges from about 3 nm to about 85 nm, in accordance with some embodiments. The width W3 of the trench 162 ranges from about 5 nm to about 70 nm, in accordance with some embodiments. A ratio (W3/W2) of the width W3 of the trench 162 to the width W2 of the trench 152 ranges from about 1.05 to about 42.5, in accordance with some embodiments. The ratio (W3/W2) of the width W3 of the trench 162 to the width W2 of the trench 152 ranges from about 1.1 to about 35, in accordance with some embodiments.

Figure 1E:
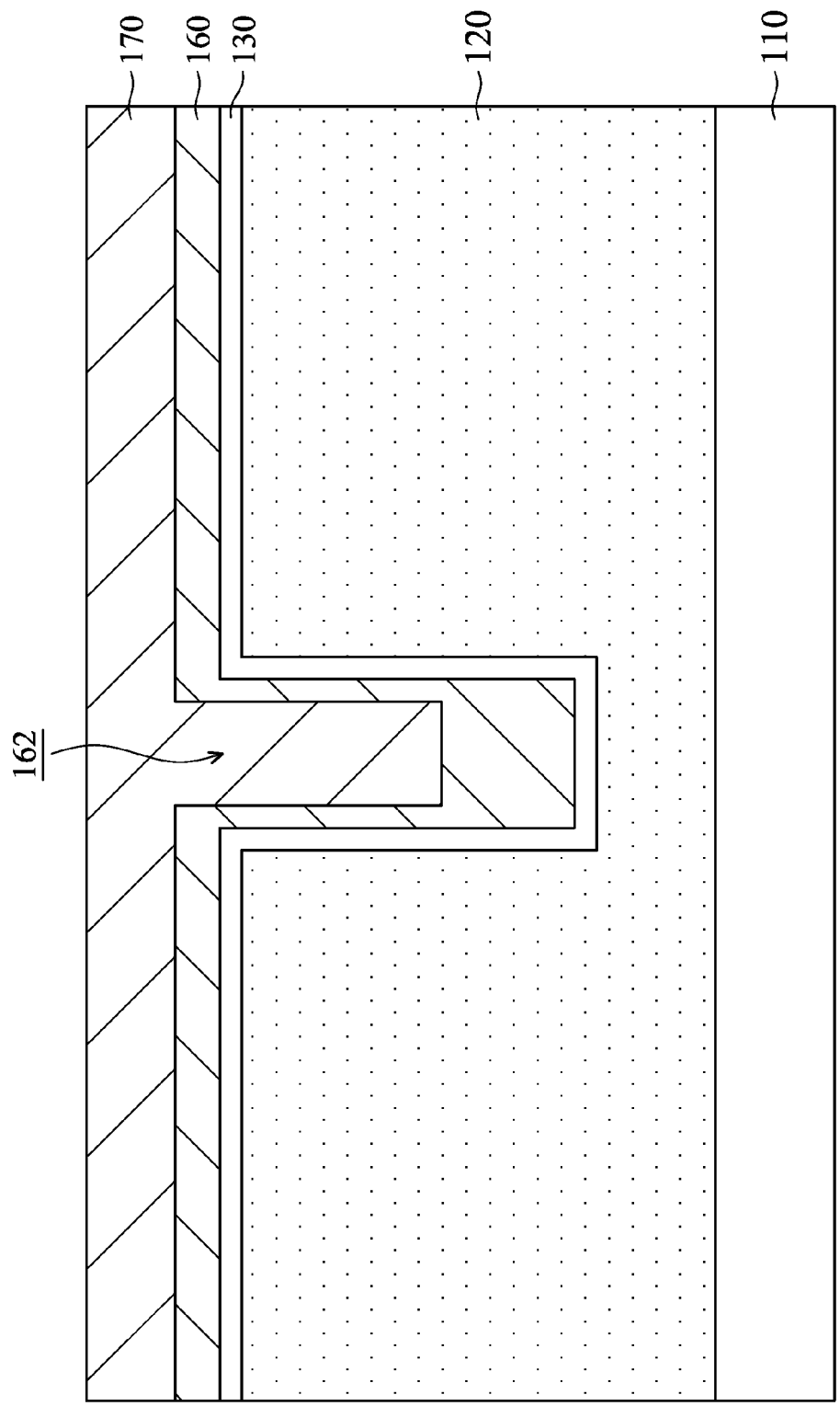

As shown in FIG. 1E, a conductive layer 170 is deposited on the conductive layer 160 to fill the third trench 162, in accordance with some embodiments. In some embodiments, the conductive layer 170 is made of any suitable conductive material, such as copper, a copper alloy, silver, gold, or a combination thereof. The conductive layer 170 is deposited by an electrochemical plating process, an electroless plating process or other suitable processes.

Figure 1F:
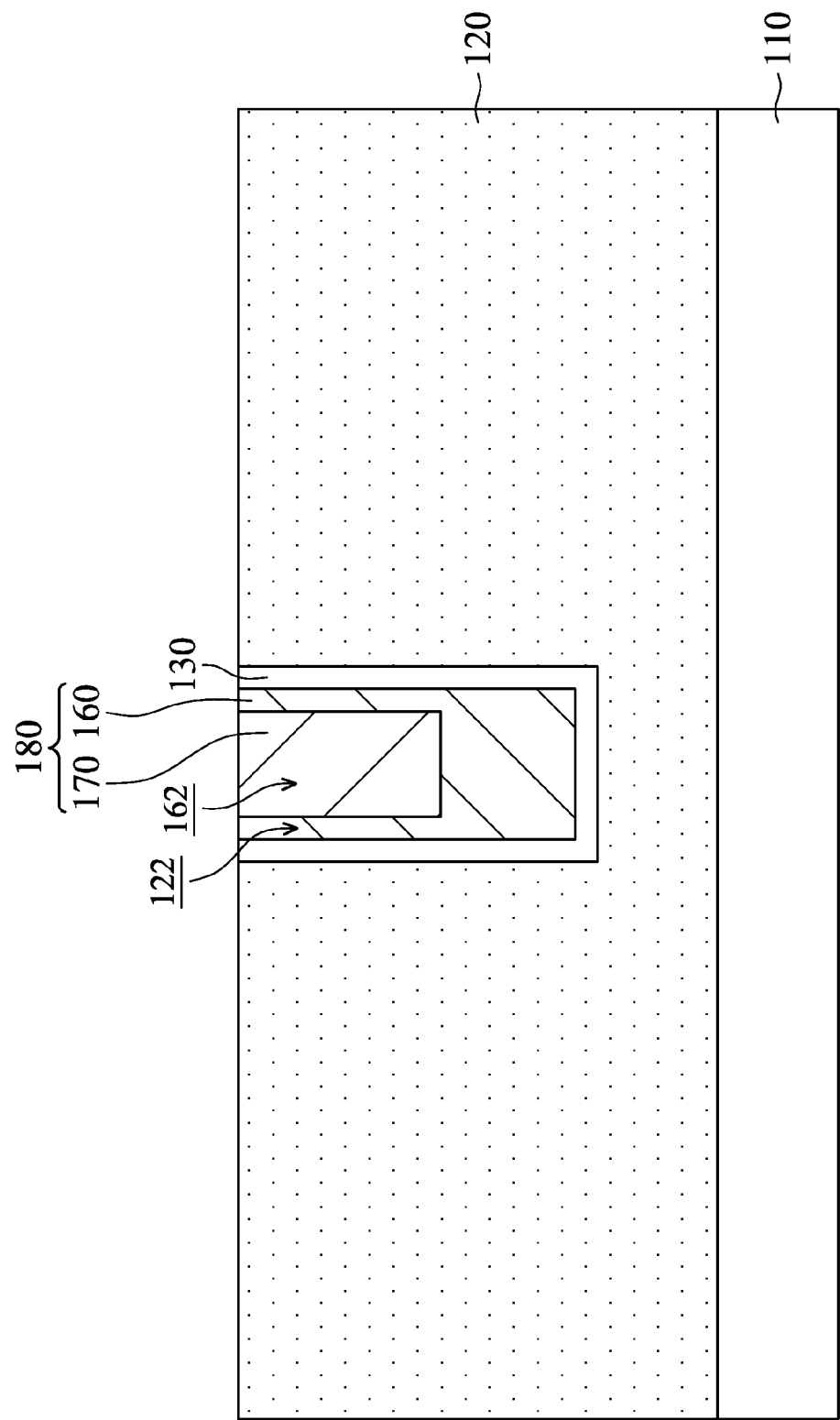

As shown in FIG. 1F, portions of the conductive layer 160 and the conductive layer 170 outside of the first trench 122 are removed, in accordance with some embodiments. The removal of the portions of the conductive layers 160 and 170 outside of the first trench 122 includes a chemical-mechanical polishing process or other suitable removal processes. A conductive line 180 composed of the conductive layers 160 and 170 remaining in the first trench 122 is formed, in accordance with some embodiments. The third trench 162 formed in the thermal treatment process has a small aspect ratio, which facilitates the filling of the conductive layer 170 into the third trench 162 and therefore prevents voids from being formed in the conductive line 180. Therefore, the yield and/or the reliability of the conductive line 180 are improved.

In accordance with some embodiments, methods for forming a semiconductor device structure are provided. The methods form a first conductive layer on a seed layer in a first trench, and the first conductive layer partially fills the first trench. The methods perform a thermal treatment process to melt and transform the seed layer and the first conductive layer into a second conductive layer having a third trench with a small aspect ratio. Therefore, the thermal treatment process facilitates the filling of a third conductive layer subsequently formed into the third trench, and therefore prevents voids from being formed in a conductive line formed from the second and the third conductive layers. As a result, the yield and/or the reliability of the conductive line are improved.

In accordance with some embodiments, a method for forming a semiconductor device structure is provided. The method includes forming a dielectric layer on a semiconductor substrate. The dielectric layer has at least one first trench in the dielectric layer. The method also includes forming a seed layer on a sidewall and a bottom surface of the first trench. The method further includes forming a first conductive layer on the seed layer. The method includes performing a thermal treatment process to melt and transform the seed layer and the first conductive layer into a second conductive layer. The method also includes forming a third conductive layer on the second conductive layer to fill the first trench.

In accordance with some embodiments, a method for forming a semiconductor device structure is provided. The method includes forming a dielectric layer on a semiconductor substrate. The dielectric layer has at least one first trench in the dielectric layer. The method also includes forming a seed layer on a sidewall and a bottom surface of the first trench. The method further includes forming a first conductive layer on the seed layer. The method includes performing a thermal treatment process to melt and transform the seed layer and the first conductive layer into a second conductive layer. On the bottom surface of the trench, a first bottom thickness of the second conductive layer is greater than a sum of a second bottom thickness of the first conductive layer and a third bottom thickness of the seed layer. The method also includes forming a third conductive layer on the second conductive layer to fill the first trench.

In accordance with some embodiments, a method for forming a semiconductor device structure is provided. The method includes forming a dielectric layer on a semiconductor substrate. The dielectric layer has at least one first trench in the dielectric layer. The method also includes forming a seed layer on a sidewall and a bottom surface of the first trench. The method further includes forming a first conductive layer on the seed layer. The method includes performing a thermal treatment process to melt and transform the seed layer and the first conductive layer into a second conductive layer. A thermal treatment temperature of the thermal treatment process ranges from about 40° C. to about 400° C. The method also includes forming a third conductive layer on the second conductive layer to fill the first trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a dielectric layer on a semiconductor substrate, wherein the dielectric layer has at least one first trench in the dielectric layer;
    forming a seed layer on a sidewall and a bottom surface of the first trench;
    forming a first conductive layer on the seed layer, wherein a bottom deposition rate of the first conductive layer is greater than a sidewall deposition rate of the first conductive layer;
    performing a thermal treatment process to melt and transform the seed layer and the first conductive layer into a second conductive layer; and
    forming a third conductive layer on the second conductive layer to fill the first trench.

2. The method for forming a semiconductor device structure as claimed in claim 1, further comprising:
    removing portions of the second conductive layer and the third conductive layer outside of the first trench.

3. The method for forming a semiconductor device structure as claimed in claim 1, wherein the forming of the first conductive layer comprises an electro-chemical plating process or an electroless plating process.

4. The method for forming a semiconductor device structure as claimed in claim 1, wherein the forming of the third conductive layer comprises an electro-chemical plating process or an electroless plating process.

5. The method for forming a semiconductor device structure as claimed in claim 1, wherein the first conductive layer has a second trench in the first trench, the second conductive layer has a third trench in the first trench, and a first width of the third trench is greater than a second width of the second trench.

6. The method for forming a semiconductor device structure as claimed in claim 5, wherein a ratio of the first width of the third trench to the second width of the second trench ranges from about 1.05 to about 42.5.

7. The method for forming a semiconductor device structure as claimed in claim 1, wherein on the sidewall of the first trench, the second conductive layer has a smaller sidewall thickness than a sum of sidewall thicknesses of the seed layer and the first conductive layer.

8. The method for forming a semiconductor device structure as claimed in claim 7, wherein a ratio of the sidewall thickness of the second conductive layer to the sum of the sidewall thicknesses of the seed layer and the first conductive layer ranges from about 0.011 to about 0.95.

9. A method for forming a semiconductor device structure, comprising:
    forming a dielectric layer on a semiconductor substrate, wherein the dielectric layer has at least one first trench in the dielectric layer;
    forming a seed layer on a sidewall and a bottom surface of the first trench;
    forming a first conductive layer on the seed layer, wherein a bottom deposition rate of the first conductive layer is greater than a sidewall deposition rate of the first conductive layer;
    performing a thermal treatment process to melt and transform the seed layer and the first conductive layer into a second conductive layer, wherein on the bottom surface of the trench, a first bottom thickness of the second conductive layer is greater than a sum of a second bottom thickness of the first conductive layer and a third bottom thickness of the seed layer; and
    forming a third conductive layer on the second conductive layer to fill the first trench.

10. The method for forming a semiconductor device structure as claimed in claim 9, further comprising:
    removing portions of the second conductive layer and the third conductive layer outside of the first trench.

11. The method for forming a semiconductor device structure as claimed in claim 9, wherein the forming of the first conductive layer comprises an electro-chemical plating process or an electroless plating process.

12. The method for forming a semiconductor device structure as claimed in claim 9, wherein a ratio of the bottom deposition rate to the sidewall deposition rate of the first conductive layer ranges from about 2 to about 50.

13. The method for forming a semiconductor device structure as claimed in claim 12, wherein the ratio of the bottom deposition rate to the sidewall deposition rate of the first conductive layer ranges from about 2 to about 30.

14. The method for forming a semiconductor device structure as claimed in claim 9, wherein the first conductive layer has a second trench in the first trench, the second conductive layer has a third trench in the first trench, and a first width of the third trench is greater than a second width of the second trench.

15. A method for forming a semiconductor device structure, comprising:
    forming a dielectric layer on a semiconductor substrate, wherein the dielectric layer has at least one first trench in the dielectric layer;
    forming a seed layer on a sidewall and a bottom surface of the first trench;
    forming a first conductive layer on the seed layer, wherein a bottom deposition rate of the first conductive layer is greater than a sidewall deposition rate of the first conductive layer;
    performing a thermal treatment process to melt and transform the seed layer and the first conductive layer into a second conductive layer, wherein a thermal treatment temperature of the thermal treatment process ranges from about 40° C. to about 400° C.; and
    forming a third conductive layer on the second conductive layer to fill the first trench.

16. The method for forming a semiconductor device structure as claimed in claim 15, wherein the thermal treatment temperature of the thermal treatment process ranges from about 40° C. to about 200° C.

17. The method for forming a semiconductor device structure as claimed in claim 15, wherein a processing time of the thermal treatment process ranges from about 5 seconds to about 300 seconds.

18. The method for forming a semiconductor device structure as claimed in claim 17, wherein the processing time of the thermal treatment process ranges from about 10 seconds to about 60 seconds.

19. The method for forming a semiconductor device structure as claimed in claim 15, wherein a thermal treatment temperature of the thermal treatment process ranges from about 100° C. to about 200° C., and a processing time of the thermal treatment process ranges from about 20 seconds to about 40 seconds.

* * * * *